United States Patent
Moroz et al.

(10) Patent No.: US 9,325,348 B2
(45) Date of Patent: Apr. 26, 2016

(54) METHOD AND SYSTEM OF INTELLIGENT ERROR CORRECTION FOR HARDWARE DATA STORAGES

(71) Applicant: Pronet Labs Ltd., Road Town, Tortola (VG)

(72) Inventors: Vladimir V. Moroz, Dubna (RU);
Sergey V. Ulyanov, Dubna (RU);
Vladimir N. Dobrynin, Dubna (RU);
Michail M. Slobodskih, Dubna (RU)

(73) Assignee: Pronet Labs Ltd., Road Town (VG)

( * ) Notice: Subject to any disclaimer, the term of this patent is extended or adjusted under 35 U.S.C. 154(b) by 214 days.

(21) Appl. No.: 14/258,426

(22) Filed: Apr. 22, 2014

(65) Prior Publication Data

US 2014/0325268 A1    Oct. 30, 2014

Related U.S. Application Data

(60) Provisional application No. 61/815,277, filed on Apr. 24, 2013.

(51) Int. Cl.
| | | |
|---|---|---|
| G11C 29/00 | (2006.01) | |
| H03M 13/11 | (2006.01) | |
| G06F 11/10 | (2006.01) | |
| H03M 13/37 | (2006.01) | |
| H03M 13/00 | (2006.01) | |

(52) U.S. Cl.
CPC ....... *H03M 13/1148* (2013.01); *G06F 11/1012* (2013.01); *H03M 13/1105* (2013.01); *H03M 13/3707* (2013.01); *H03M 13/616* (2013.01)

(58) Field of Classification Search
CPC ............... H03M 13/1148; H03M 13/1105; H03M 13/3707; G06F 11/1012
See application file for complete search history.

(56) References Cited

U.S. PATENT DOCUMENTS

| | | | | |
|---|---|---|---|---|
| 7,480,845 B2* | 1/2009 | Kim | .......... | H03M 13/116 714/752 |
| 9,214,963 B1* | 12/2015 | Garani | .......... | H03M 13/2906 |
| 2004/0260998 A1* | 12/2004 | Sutskover | .......... | H04L 1/0009 714/758 |
| 2008/0028274 A1* | 1/2008 | Lin | .......... | H03M 13/1108 714/752 |

* cited by examiner

*Primary Examiner* — Sam Rizk
(74) *Attorney, Agent, or Firm* — Georgiy L. Khayet

(57) ABSTRACT

Methods and systems for correction of errors on a hardware data storage are provided. An example method for correction of errors on a hardware data storage can include receiving input data. The input data may include at least error statistics data and reliability data. The method can further include creating a set of matrices with predefined properties. The set of matrices can be created based on the input data. The set of matrices may include at least a generating matrix, a parity check matrix, and a decoding matrix. The method can continue with detecting the errors using the set of matrices. Upon detection of the errors, the method may further include correcting the errors using the set of matrices.

20 Claims, 14 Drawing Sheets

METHOD AND SYSTEM OF INTELLIGENT ERROR CORRECTION FOR HARDWARE DATA STORAGES

RELATED APPLICATIONS

The present application claims the benefit of U.S. provisional application No. 61/815,277 filed on Apr. 24, 2013. The subject matter of the aforementioned application is incorporated herein by reference for all purposes.

TECHNICAL FIELD

This application relates generally to data processing and, more specifically, to error correction systems for correcting errors in hardware memory storages.

BACKGROUND

With the increase of volume of electronic data storages, also referred to as hardware memory storages, the number of storing procedure errors also increases. The endurance of the electronic data storage can be defined as the number of Program and Erase (P/E) cycles that each memory cell can tolerate throughout its lifetime. Single-level cell (SLC) NAND flash technology, being one of the mainstream NAND flash technologies, achieves 100,000 P/E cycles at 50 nm process node. Meanwhile, the migration of NAND flash technology from removable media storage to memory- and performance-intensive mobile computing devices, such as smart phones, tablets, notebooks, and so forth, is driving up NAND flash endurance requirements. While universal serial bus (USB) flash drives and micro secure digital (microSD) memory cards, which comprised the core NAND market segments until recently, need only a few hundred P/E cycles, the NAND flash embedded in smart phones typically requires at least 3,000 P/E cycles. Enterprise-grade solid-state drives (SSD) require as much as 50,000 P/E cycles. However, the endurance of the hardware memory storage can be severely degraded in the course of P/E cycles due to process and array impairments, resulting in a nonlinear increase in the number of errors in the hardware memory storage.

The most common approach to combating endurance limitations is the use of an error correction code (ECC). The ECC utilizes data checking and correction bits, also referred to as parity bits, which are stored on the NAND flash memory in addition to the application content, also referred to as data bits. For the ECC to correct more bits, more parity bits needs to be stored, resulting in additional cost. Furthermore, an ECC scheme is usually characterized by the code rate, which is defined as a ratio between the number of data bits to the total number of stored bits (data+parity). Higher code rate is more cost-effective but typically yields weaker correction capability and is therefore more sensitive to errors.

The ECC schemes are capable of correcting more bits for a given code rate, such as irregular Low-Density Parity-Check (iLDPC) codes. However, a typical iLDPC algorithm is designed for data transmission channels rather than for electronic data storages. Furthermore, decoding algorithms for the iLDPC codes may use huge matrices dimensions resulting in complexity of matrix computations. Additionally, even the most modern and efficient ECC schemes are not effective when the number of errors is too large.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present disclosure is related to approaches for correction of errors on a hardware data storage. Specifically, a method for correction of errors on a hardware data storage is provided. In certain embodiments, the method can include receiving input data. The input data may include at least error statistics data and reliability data. The method can further include creating a set of matrices with predefined properties. The set of matrices can be created based on the input data. The set of matrices may include at least a generating matrix, a parity check matrix, and a decoding matrix. The method can continue with detecting the errors using the set of matrices. Upon detection of the errors, the method may further include correcting the errors using the set of matrices.

According to another approach of the present disclosure, there is provided a system for correction of errors on a hardware data storage. In certain embodiments, the system includes a processor and a database comprising computer-readable instructions for execution by the processor. The processor can be operable to receive input data. The input data may include at least error statistics data and reliability data. The processor can be further operable to create a set of matrices with predefined properties. The set of matrices can be created based on the input data. The set of matrices may include at least a generating matrix, a parity check matrix, and a decoding matrix. The processor can be operable to detect the errors using the set of matrices. Upon detection of the errors, the processor can be operable to correct the errors using the set of matrices.

In further example embodiments of the present disclosure, the method steps are stored on a machine-readable medium comprising instructions, which when implemented by one or more processors perform the recited steps. In yet further example embodiments, hardware systems, or devices can be adapted to perform the recited steps. Other features, examples, and embodiments are described below.

The following detailed description together with the accompanying drawings will provide a better understanding of the nature and advantages of the present technology.

BRIEF DESCRIPTION OF DRAWINGS

Embodiments are illustrated by way of example and not limitation in the figures of the accompanying drawings, in which like references indicate similar elements and in which:

FIG. 9 is a schematic representation of structures of a matrix and encoded data, according to an example embodiment.

FIG. 10 is a schematic representation of a code with errors and a corrected code, according to an example embodiment.

DETAILED DESCRIPTION

Figure 1:
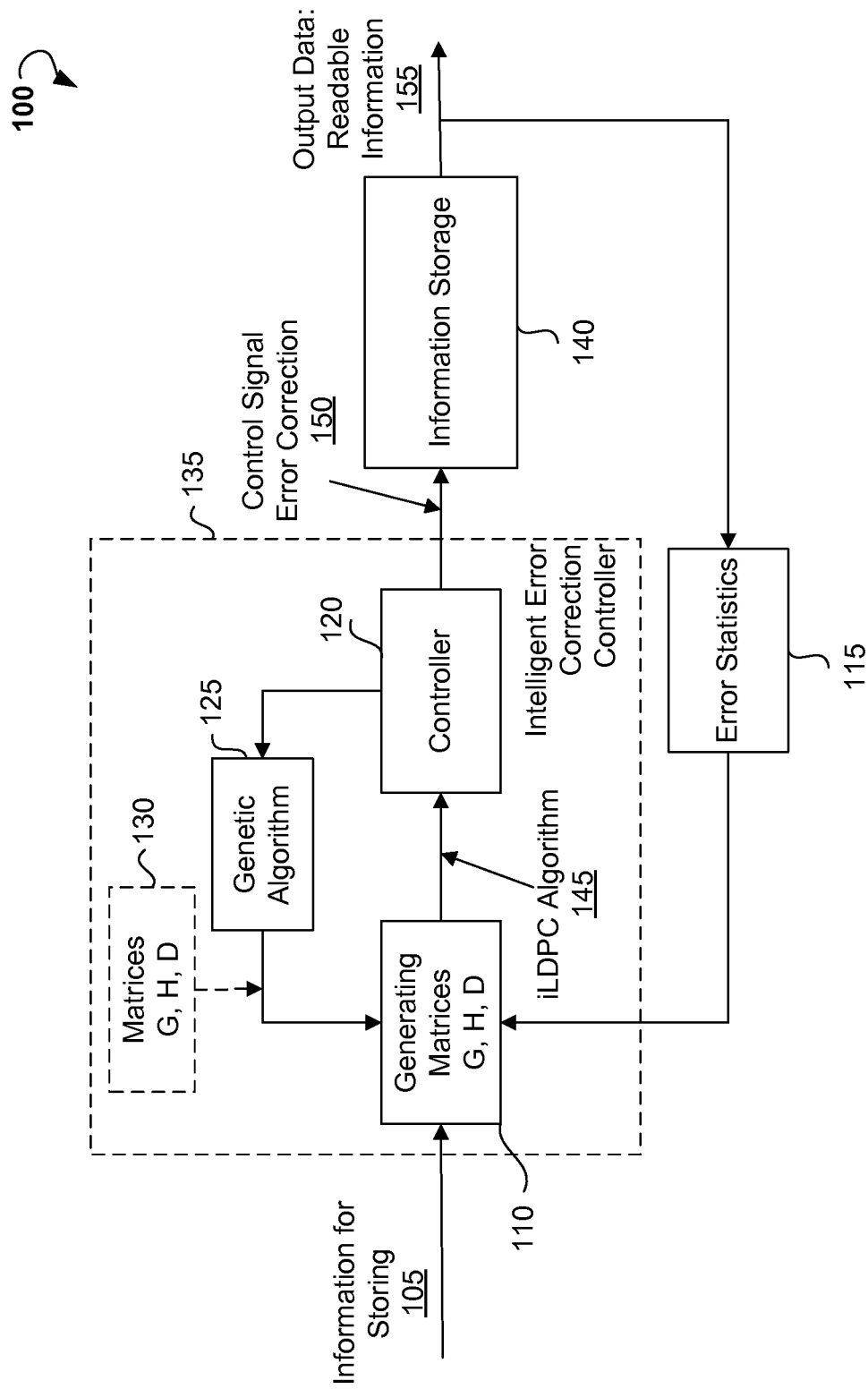
FIG. 1 shows a block diagram illustrating an example environment within which methods and systems for correction of errors on a hardware data storage can be implemented, according to an example embodiment.

In the following description, numerous specific details are set forth in order to provide a thorough understanding of the presented concepts. It should be understood, however, that the presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In accordance with various embodiments and the corresponding disclosure thereof, computer-implemented methods and systems for correction of errors on a hardware data storage are provided. The described methods and systems allow maintaining the required entropy level of stored data. The principle of holding the entropy level provides a guaranteed quality of the stored data, with a given level of safety, due to correction of all errors. Maintaining the required level of stored data entropy is a fundamental principle of a system for error correction. This principle provides for quality of the stored information, which is guaranteed (with a given level of reliability) by error correction. From the perspective of organization of the system for error correction on the principle of "input-process-output," the process of supporting the level of entropy includes the following subprocesses: procedures of reading and writing, with embedded intelligent control procedures for error correction data storage, which in turn are embedded within the procedure of genetic algorithm for generating creation matrices, decoding and parity check (i.e., verification).

The method for correction of errors on hardware data storages is based on an iLDPC algorithm for hardware data storages with constant value of error recovery probability. The iLDPC codes of the iLDPC algorithm are binary linear block codes based on a sparse parity check matrix. According to the iLDPC algorithm, a principle of optimal matrices is used. The principle of optimal matrices provides the largest minimum differences between storing codes.

According to the method for correction of errors on hardware data, a set of matrices is created based on the input data. The input data may include at least error statistics data and reliability data. The set of matrices may include a generating matrix. The generating matrix is created using a genetic algorithm.

In science, a genetic algorithm is a global optimization technique which takes the concepts of biological evolution and Darwinian survival and applies them to finding optimal solutions to some generally hard problem. The basic operation of the genetic algorithm is conceptually simple. More specifically, the genetic algorithm includes creating a population of solutions to some problem, selecting and combining the better solutions in some manner, and using the combination of the better solutions to replace poorer solutions. The combination of selection pressure and innovation generally leads to improved solutions (often approaching the globally optimal solution).

According to the genetic algorithm, the problem to be solved need to be expressed through artificial chromosomes, each of which represents one possible solution to the problem. A chromosome may be a string of bits, a list of parameters, or a more complex representation, such as a tree of procedures, but it need to represent some embodiment of a solution to the problem. The genetic algorithm requires a method to evaluate how good or bad a particular solution, or chromosome, is. This is usually some function that takes as its inputs the chromosome, and outputs a fitness measure, and the fitness is what the genetic algorithm uses to score the potential solution.

Having encoded the problem onto a chromosome, and having an evaluation procedure, the genetic algorithm evolves solutions to the problem by creating a population of chromosomes. A population is generally randomly created, and for each individual in the population, a fitness of the individual is determined. The genetic algorithm then selects the individuals with the highest fitness. Further, the genetic algorithm performs some genetic operations on the selected individuals to create a new generation of individuals for the population, which replace the individuals in the population with generally the worst fitness. The effect is an overall improvement in fitness.

When applying the genetic algorithm to the methods and system of the present disclosure, the genetic algorithm includes the steps of creation of an initial set of matrices, crossing the set of initial matrices, mutating the obtained matrices, and selecting the most suitable matrices. As a result of the genetic algorithm, the generating matrix is created. In general, the generating matrix is used to encode write data to obtain a code.

The set of matrices may further include a parity check matrix, which is based on the generating matrix. The parity check matrix may be used to show the position of faulty code bits and to perform error correction. The error correction may be performed by maximizing the difference between storing codes. As a result of using the parity check matrix, a corrected code can be obtained.

The set of matrices may further include a decoding matrix, which is based on the generating matrix. The decoding matrix is used to decode the corrected code and to obtain output data.

Referring now to the drawings, FIG. 1 is a block diagram showing an environment within which methods and systems for correction of errors on a hardware data storage may be implemented, according to an example embodiment.

FIG. 1 shows an architecture 100 in which each block represents a separate subsystem with agreed inputs and outputs. The architecture 100 includes a block 110 responsible for generating matrices. The matrices include a generating matrix G, a parity check matrix H, and a decoding matrix D. Write data shown as information 105 for storing can be received by the block 110. The block 110 may also receive error statistics from a block 115 responsible for keeping error statistics. The block 110 can generate matrices 130 shown as matrices G, H, and D using a genetic algorithm 125. The block 110 can send the generated matrices 130 to a controller 120. The controller 120 can be responsible for performing error correction using the received matrices 130. Furthermore, the controller 120 can use an iLDPC algorithm 145 for error correction. The controller 120, the genetic algorithm 125, and the block 110 generating matrices G, H, and D can be comprised within an intelligent error correction controller 135.

After performing the error correction by the controller 120, the information may be sent to a block 140 responsible for storing the information. In an example embodiment, a block 150 may perform error correction of a control signal from the controller 120. Thereby, output data 155 can be obtained. The output data 155 can include readable information stored on a hardware data storage.

Figure 2:
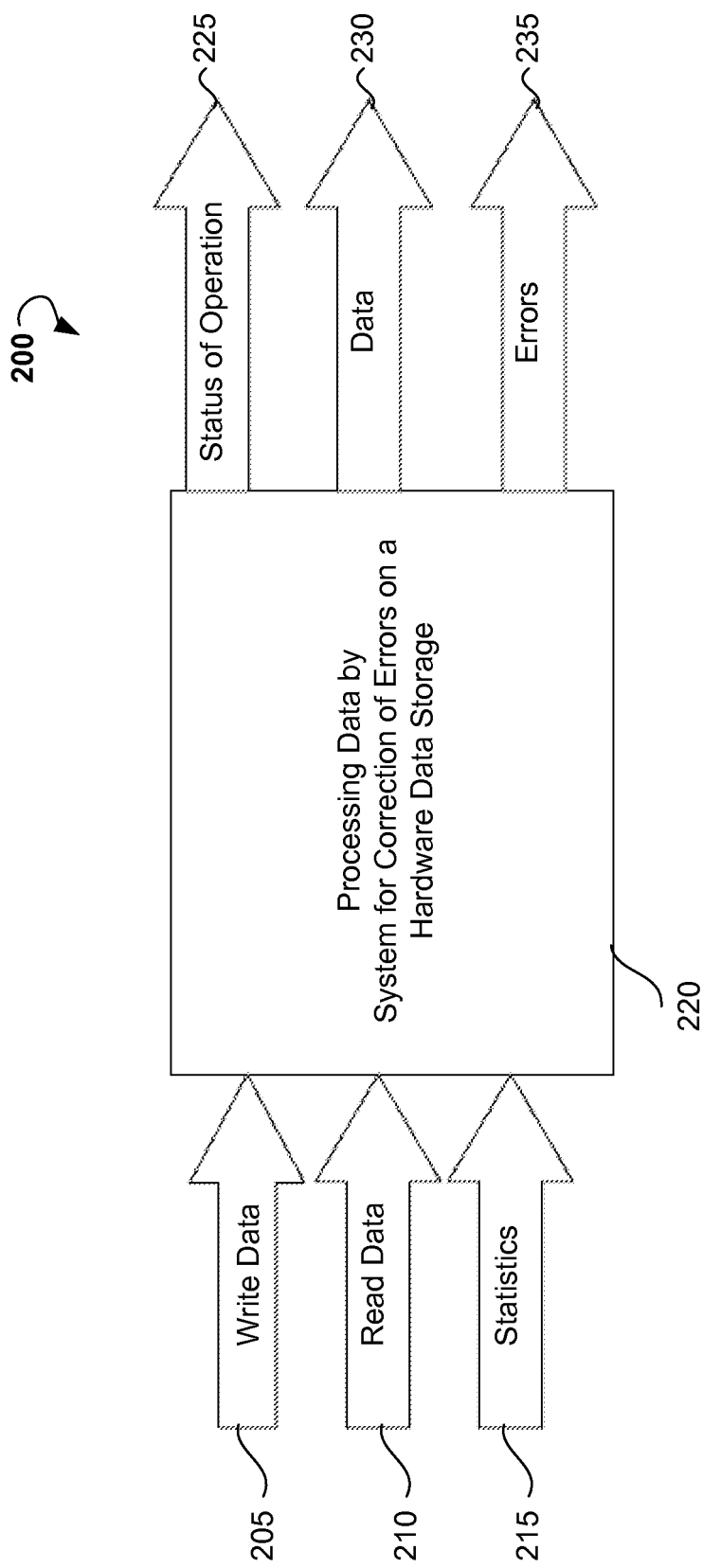
FIG. 2 is a block diagram illustrating an input-process-output principle of a system for correction of errors on a hardware data storage, according to an example embodiment.

FIG. 2 is a block diagram 200 illustrating an "input-process-output" principle of a system for correction of errors on a hardware data storage. More specifically, the input phase can include steps of writing data, shown as block 205, reading data, shown as block 210, and receiving statistic data, shown as block 215. All data received on the input step are processed, at a block 220, by the system for correction of errors on the hardware data storage. Processing can include error correction using a genetic algorithm for creation generating matrices, parity check matrices, and decoding matrices. The output phase can include providing status of the operation, shown as block 225, providing data, in which errors are corrected, shown as block 230, and providing data associated with the error, shown as block 235.

Figure 3:
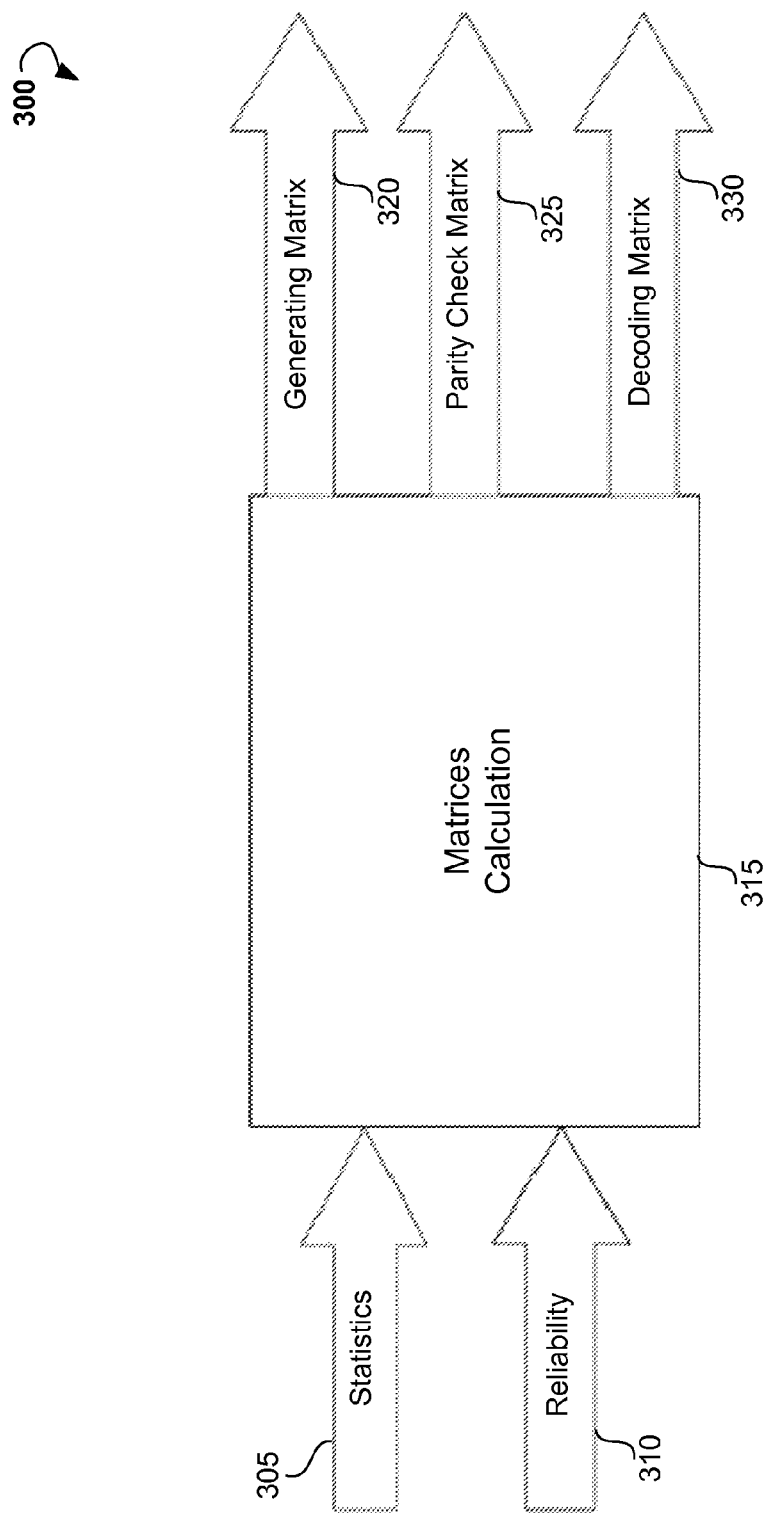
FIG. 3 is a block diagram illustrating matrices calculation, according to an example embodiment.

FIG. 3 is a block diagram 300 illustrating a matrices calculation block 315. The matrices can be calculated using the principle of optimal matrices, which provides the largest minimum difference between storing codes. The inputs of the matrices calculation block 315 can comprise error statistics 305 and reliability data 310. The outputs of the matrices calculation block 315 can comprise a generating matrix (G), shown as generating matrix 320, a parity check matrix (H), shown as parity check matrix 325, and a decoding matrix (D), shown as decoding matrix 330. All the matrices can be calculated using an iLDPC algorithm so as to satisfy the principle of maintaining a given level of entropy.

Figure 4:
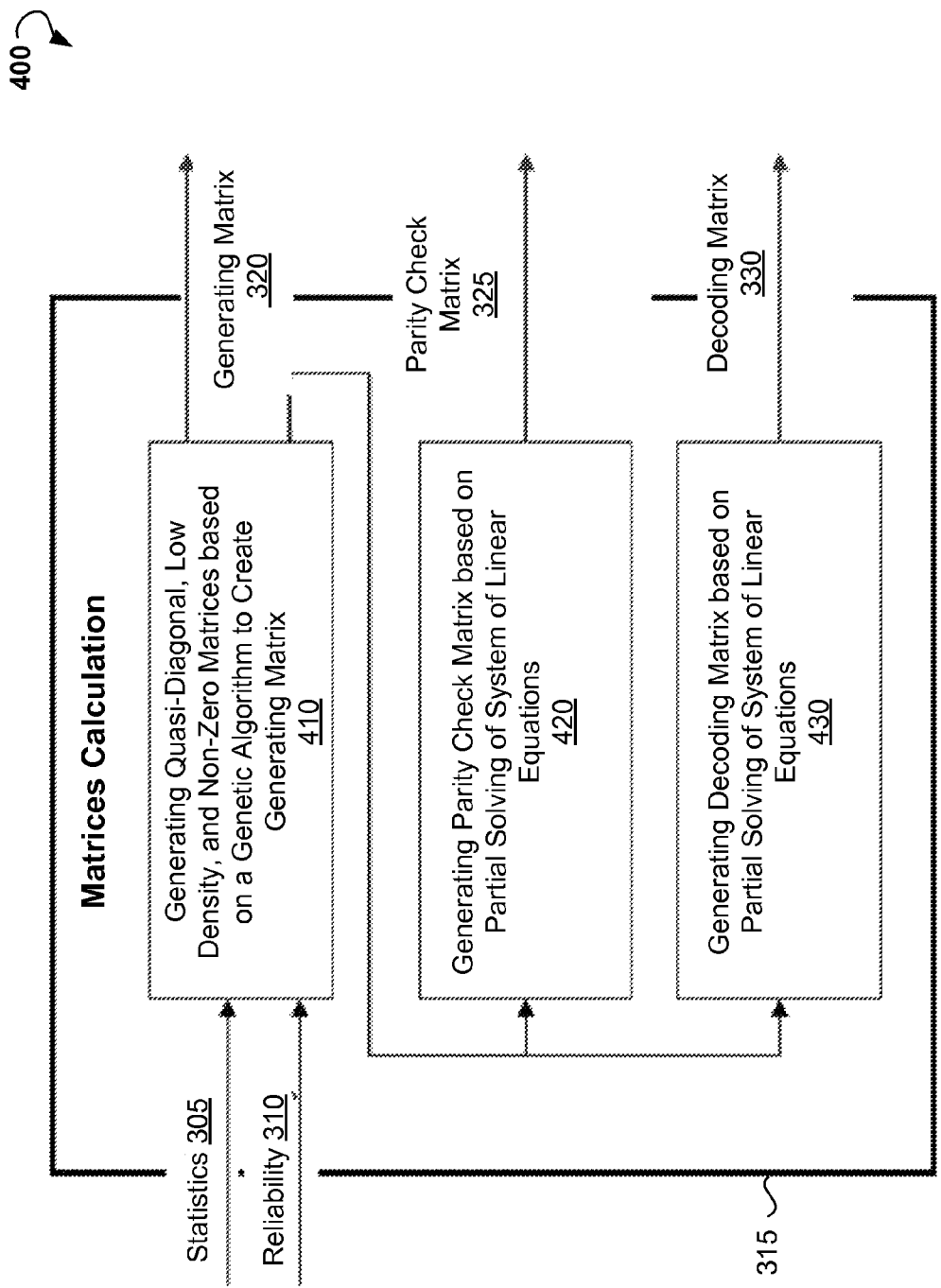
FIG. 4 is a block diagram illustrating matrices calculation, according to an example embodiment.

The matrices calculation block 315 is shown in detail on a block diagram 400 of FIG. 4. Based on the input data, such as error statistics 305 and reliability data 310, irregular, quasi-diagonal, low density, high dimension, and non-zero matrices can be generated at block 410. The irregular, quasi-diagonal, low density, high dimension, and non-zero matrices can be generated based on the genetic algorithm. Furthermore, based on the irregular, quasi-diagonal, low density, high dimension, and non-zero matrices, a generating matrix 320 may be created at block 410.

Figure 5:
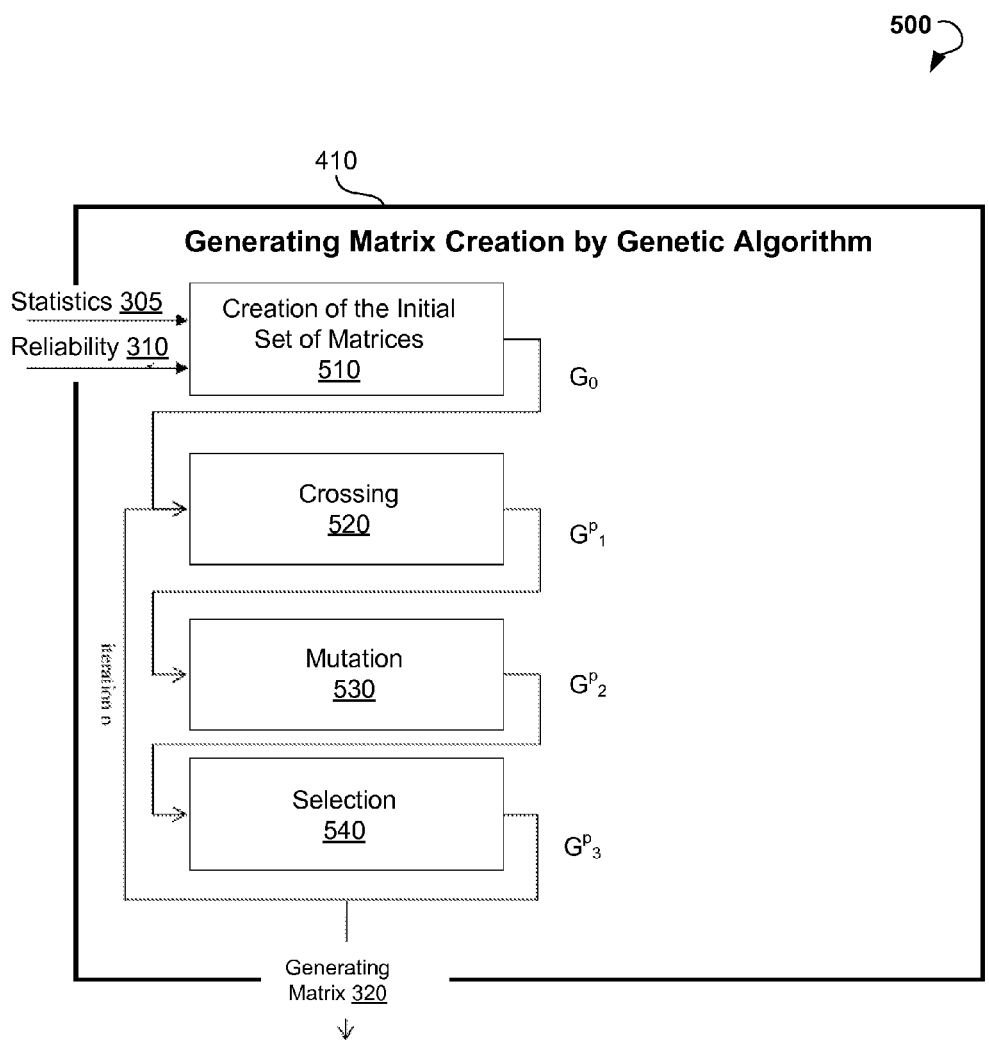
FIG. 5 is a block diagram illustrating creation of a generating matrix, according to an example embodiment.

Block 410 of creating the generating matrix (G) is shown in detail on a block diagram 500 of FIG. 5. The generating matrix can be created using the genetic algorithm. The genetic algorithm may be used to find the maximum between minimum code distances. Inputs of genetic algorithm can include error statistics 305 and reliability data 310. The genetic algorithm can be used to find an optimal configuration of the system for error correction of the data storage. Such a configuration can be used to restore corrupted codes.

According to an example embodiment, the genetic algorithm can start with creation of an initial set $G_0$ of matrices at block 510. The initial set $G_0$ of matrices can include matrices with specified properties, such as matrices being quasi-diagonal, having low density, and being non-zero, as well as having m×n dimension of quasi-diagonals. A pseudorandom number generator can be used for completing the initial matrices with required m×n dimension of quasi-diagonals.

The genetic algorithm can continue with crossing of the initial set of matrices $G_0$ or matrices after selection $G_2^{p-1}$ at block 520. The "descendant" ($G_{1ik}^p$) can be formed for each pair ($G_{1i}^p$, $G_{1k}^p$) according to the following rule: the operation is chosen from the specified set of crossing operations (S) and applied to the matrices pair $G_{1ik}^p = s(G_{1i}^p, G_{1k}^p)$. $G_1^p$ can be a set of matrices having m×n dimension and obtained by mixing diagonals of a pair of matrices from $G_0$ and $G_2^{p-1}$. The crossing operations (S) can include:

$$S = \left\{ \begin{array}{c} \text{The parts of matrix integration} \\ \text{The parts of matrix superposition} \\ \text{Selective integration of quasi-diagonals} \\ \ldots \end{array} \right\}.$$

The genetic algorithm can further include a mutation step at block 530. During the mutation step, operations μ can be chosen from the specified set of operations (M) and applied to the matrices $G_1^p:G_2^p=\mu(G_1^p)$. $G_2^p$ can be a set of matrices having m×n dimension and obtained by adding a random quasi-diagonal to matrices $G_1^p$. The operations (M) can include:

$$M = \left\{ \begin{array}{c} \text{Changing the position of diagonals} \\ \text{Changing the dimension of diagonals} \\ \text{Adding or deleting diagonals} \\ \ldots \end{array} \right\}.$$

The genetic algorithm can continue with a selection step at block 540. The selection step can include selecting a subset of matrices with the largest minimum distance between codes based on $G_2^p = f(G_2^p)$ the suitability function. $G_2^p$ is a subset of matrices from $G_2^p$, with the largest minimum distance between codes. The suitability function can be expressed as $f$=max min dist(θ·g), matrix $g \in G_2^p$, where θ is a set of data.

The selection step can be stopped after finding an optimal generating matrix $G \in G_3^p$:

$G_2^{p-1} = \max(f(G_2^p), f(G_2^{p-1}))$.

Referring back to FIG. 4, at block 420, a parity check matrix (H) 325 can be generated. The parity check matrix 325 is based on the generating matrix 320 according to the orthogonality condition $G \cdot H^T = 0$. The parity check matrix 325 can be calculated by partial solving of the low density system of binary linear equations. A quantum algorithm can be used for solving the system of binary linear equations. The parity check matrix can be used calculate the syndromes that show the position of faulty code bits. The code correction can be based on the syndromes and the parity check matrix and can be realized by the modified binary Bit Flip algorithm. According to the Bit Flip algorithm, compressed matrices can be used to correct errors of storing data. More specifically, irregular, quasi-diagonal, high dimension, low density matrices can be compressed to obtain compressed generating matrix, decoding matrix, and parity check matrix. The compressing of the matrices can allow using the matrices in the hardware with minimal memory volume requirements.

At block 430, a decoding matrix (D) 330 can be generated. The decoding matrix 330 can be based on the generating matrix 320 according to the orthogonality condition $G \cdot H^T = E$. The decoding matrix 330 can be calculated by partial solving of the low density system of binary linear equations. A quantum algorithm can be used for solving the system of binary linear equations.

Figure 6:
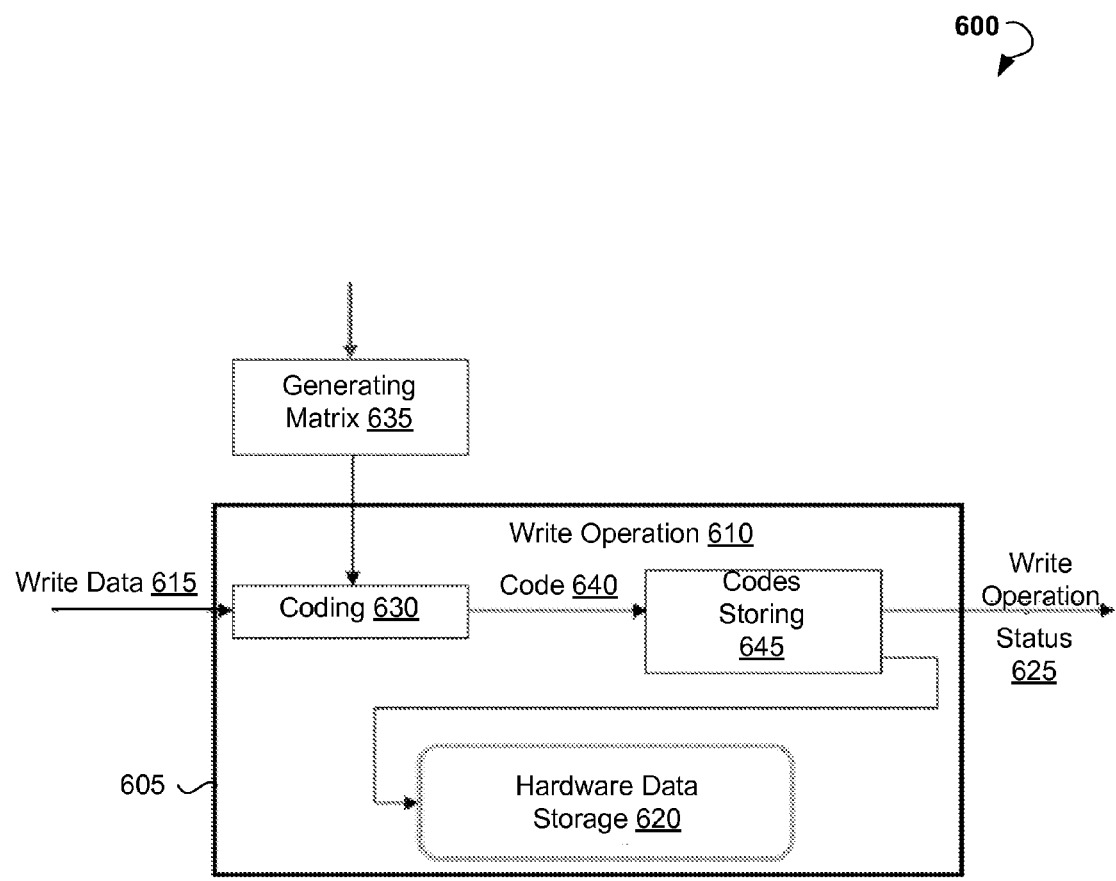
FIG. 6 is a block diagram illustrating a write operation, according to an example embodiment.

FIG. 6 is a block diagram 600 showing a write operation block 605 describing a write operation 610. The input of the write operation block 605 can be write data 615 of length m being transmitted to the hardware data storage 620. The output can be the write operation status 625. In an example embodiment, the write operation 610 includes coding the write data 615, at block 630, from the data of length m to the data of length n based on the generating matrix (G) 635. The write operation 610 further includes storing, at block 645, the resulted code 640 on the hardware data storage 620. The multiplicity of the data code's lengths n is defined by the physical organization of the hardware data storage 620. The data length m is defined by the required level of data reliability.

Figure 7:
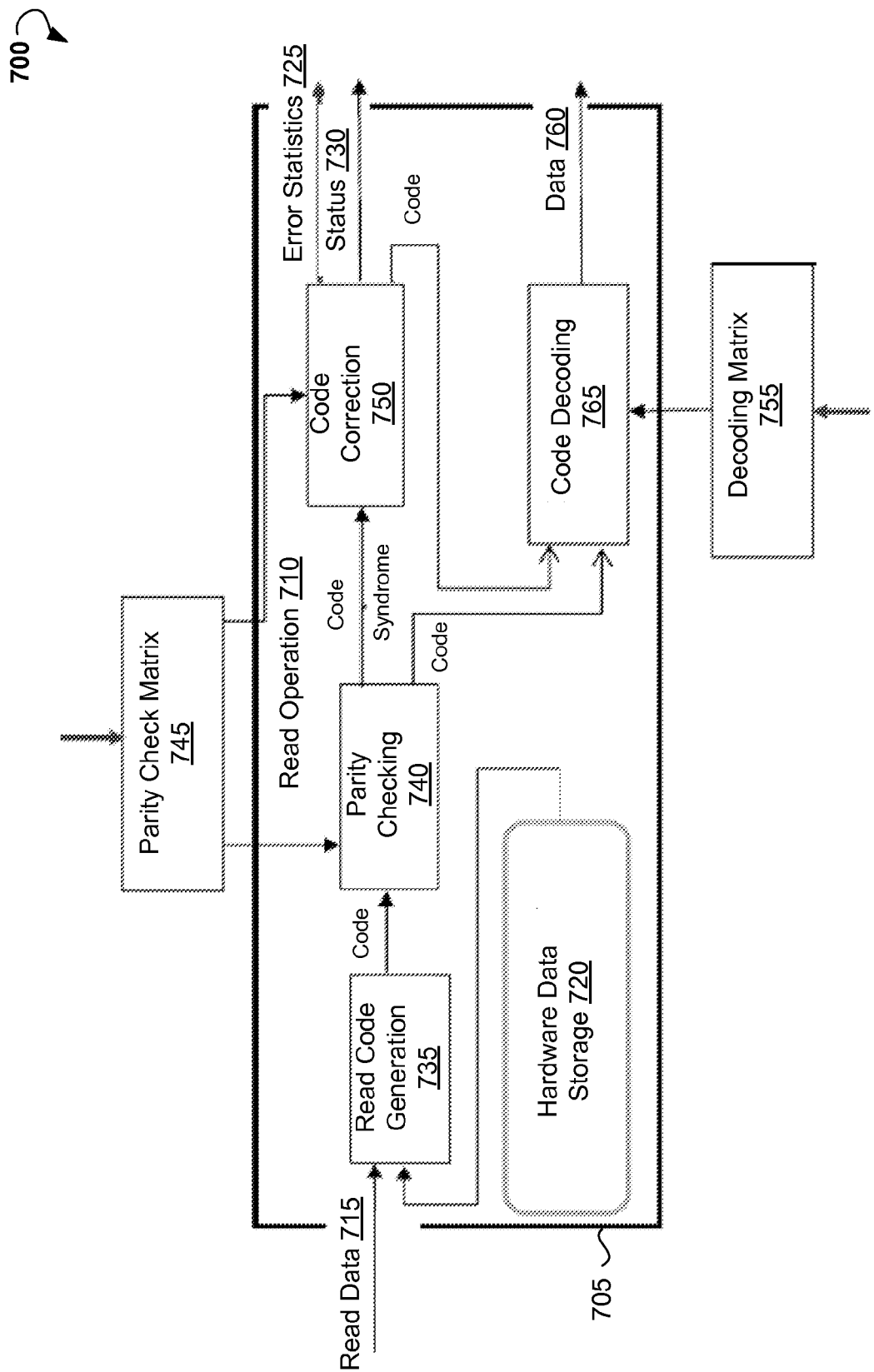
FIG. 7 is a block diagram illustrating a read operation, according to an example embodiment.

FIG. 7 is a block diagram 700 showing a read operation block 705 describing a read operation 710. The input of the read operation block 705 can be read data 715 of length m. The outputs of the read operation block 705 can be error statistics 725, status 730 of read operations, and data 760. In an example embodiment, the read operation block 705 may perform read code generation at block 735. Using the parity check matrix 745, the parity checking of the code can be performed at block 740. Furthermore, based on codes and syndromes, code correction can be performed at block 750. In an example embodiment, based on code correction, the error statistics calculation and fatal error signal generation can be performed. Using the decoding matrix 755, the code can be decoded at block 765 to provide the data 760.

Figure 8:
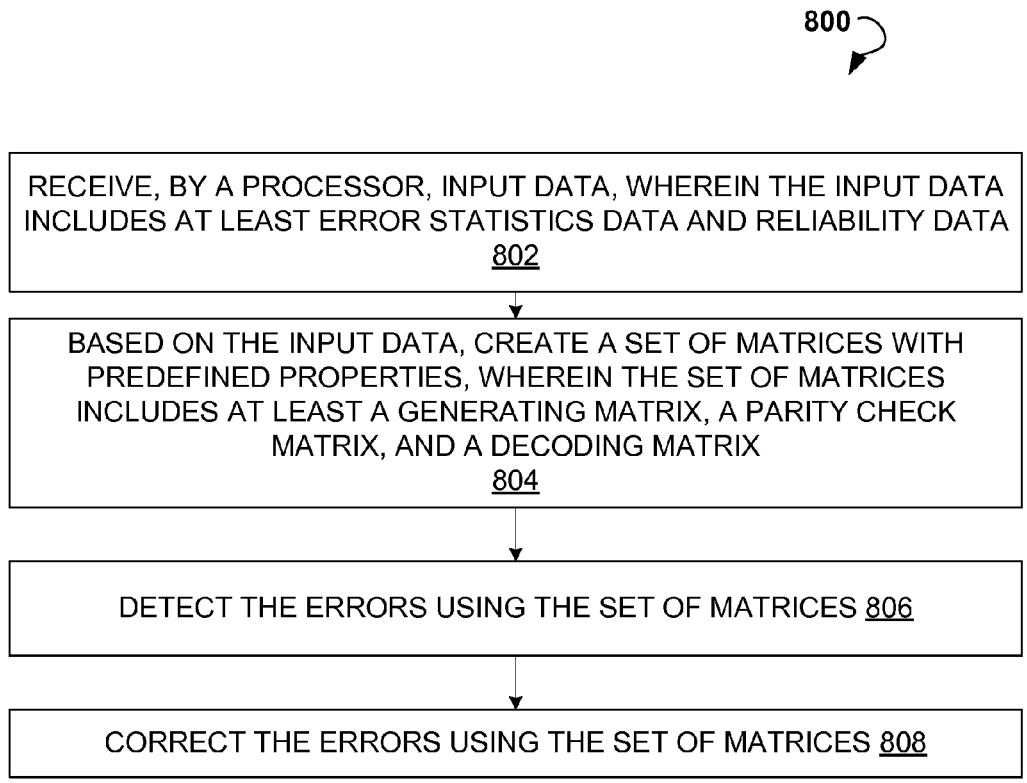
FIG. 8 is a flow chart illustrating a method for correction of errors on a hardware data storage, according to an example embodiment.

FIG. 8 shows a flow chart illustrating a method 800 for correction of errors on a hardware data storage, in accordance with an example embodiment. The method 800 may commence with receiving, by a processor, input data at operation 802. In an example embodiment, the input data include at least error statistics data and reliability data. Reliability data include probability of error correction failure of the stored data.

The method 800 may continue with creating a set of matrices with predefined properties at operation 804. The set of matrices may be created based on the input data. In an example embodiment, the set of matrices may include at least a generating matrix, a parity check matrix, and a decoding matrix.

In a further example embodiment, the generating matrix may be calculated using one or more quasi-diagonal, low density, and non-zero matrices based on a genetic selective algorithm based on a genetic algorithm. A pseudorandom number generator may be applied to the one or more quasi-diagonal, low density, and non-zero matrices for calculation of the generating matrix. In an example embodiment, calculation of the generating matrix includes selecting, from the one or more quasi-diagonal, low density, and non-zero matrices, a matrix having a largest minimum distance between codes. The calculated generating matrix may be used to encode write data and to obtain a code.

Figure 9:
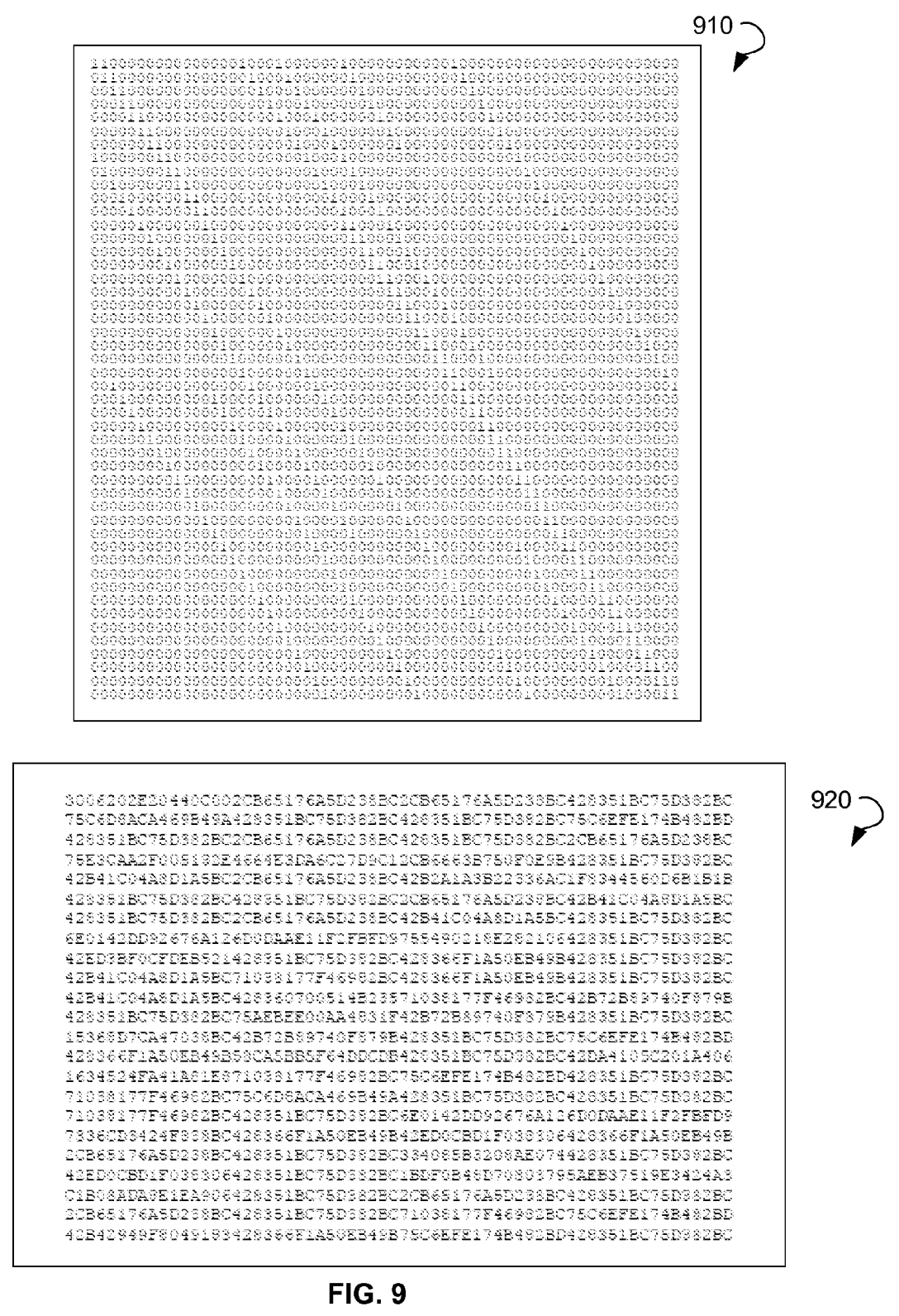

FIG. 9 shows a structure 910 of an optimal quasi-diagonal, low density, non-zero binary generating matrix, according to an example embodiment. FIG. 9 further shows a representation 920 of encoded data generated by the optimal generating matrix 910, according to an example embodiment.

Referring back to the method 800 of FIG. 8, the parity check matrix and the decoding matrix may be generated by a partial solving of a linear system of equations. The linear system of equations can be associated with the generating matrix. The calculated parity check matrix may be used to correct the code and, thereby, obtain a corrected code. The calculated decoding matrix may be used to decode the corrected code and, thereby, obtain output data.

Figure 10:
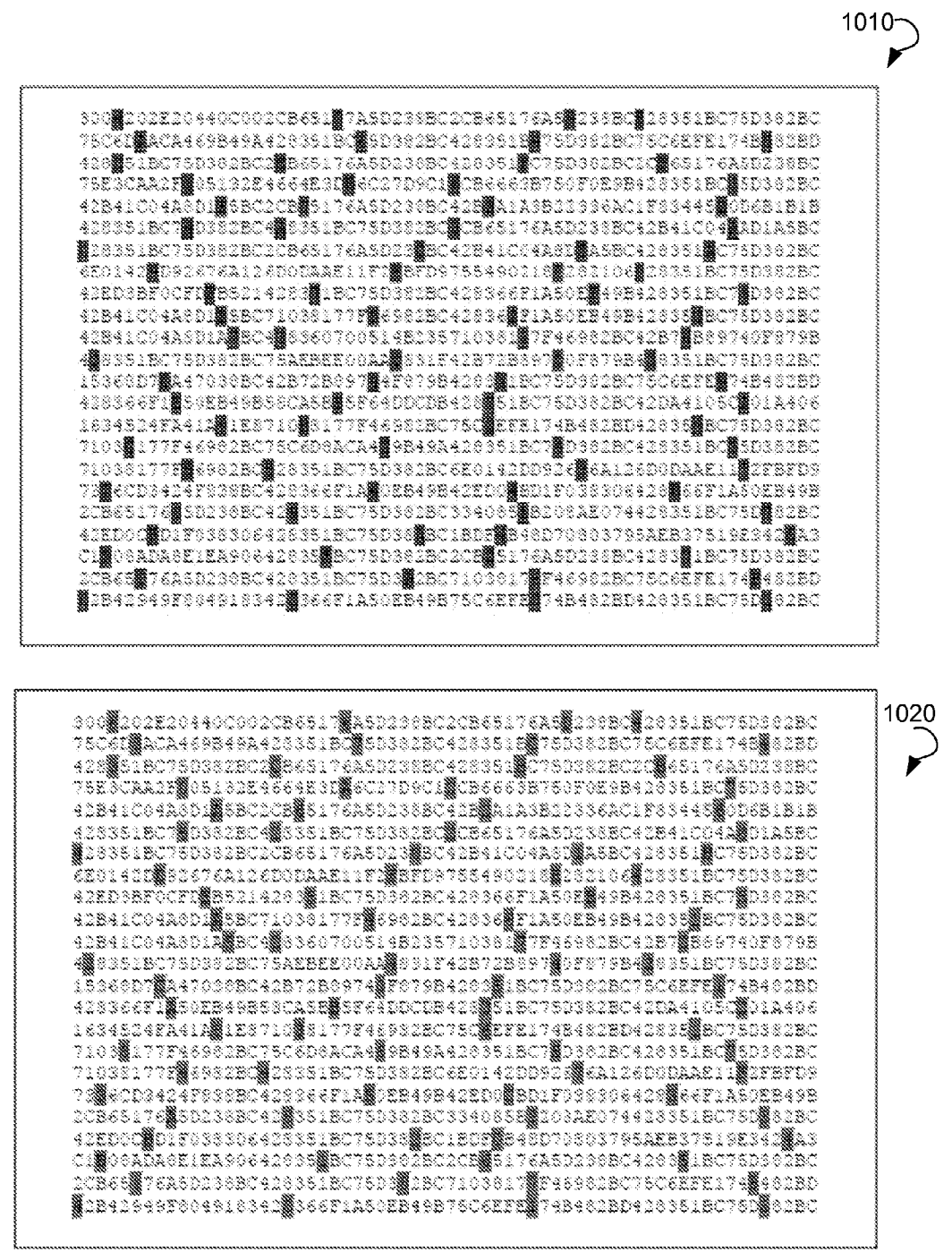

FIG. 10 is a block diagram showing a representation 1010 of a code with errors, according to an example embodiment. FIG. 10 further shows a representation 1020 of a code correction performed by using the parity check matrix.

Referring back to FIG. 8, in an example embodiment, the method 800 optionally comprises compressing each of the set of matrices.

Upon creation of the set of matrices, the method 800 may further include detecting the errors at operation 806. The errors may be detected using the set of matrices. The method 800 further includes correcting the errors at operation 808. The errors may be corrected using the set of matrices. In an example embodiment, the compressed generating matrix, parity check matrix, and decoding matrix are used to correct errors of storing data.

Figure 11:
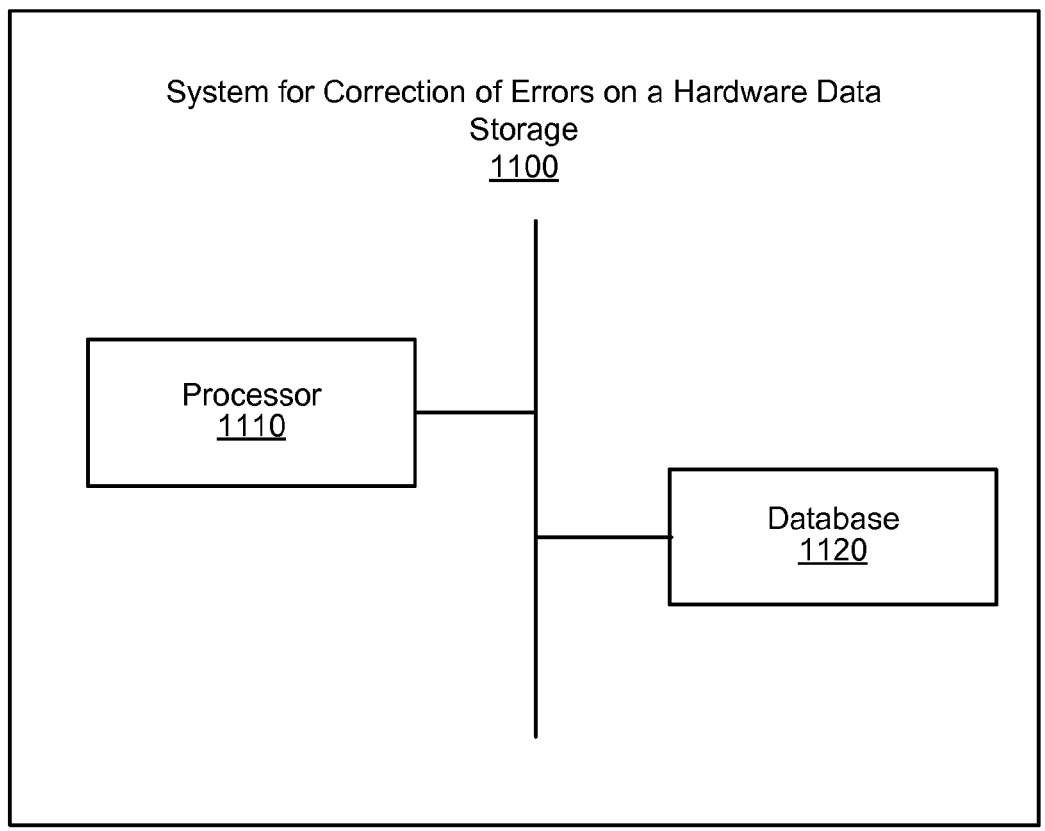
FIG. 11 is a block diagram illustrating components of a system for correction of errors on a hardware data storage, according to an example embodiment.

FIG. 11 is a schematic representation of components of a system 1100 for correction of errors on a hardware data storage, in accordance with certain embodiments. The system 1100 may comprise a processor 1110. The processor 1110 may be operable to receive input data. The input data may include at least error statistics data and reliability data.

The processor 1110 may be further operable to create a set of matrices with predefined properties. The set of matrices may be created based on the input data. The set of matrices may include at least a generating matrix, a parity check matrix, and a decoding matrix. In an example embodiment, the processor is further operable to compress each of the set of matrices, thereby creating a compressed generating matrix, a compressed parity check matrix, and a compressed decoding matrix.

In an example embodiment, the generating matrix is calculated using one or more quasi-diagonal, low density, and non-zero matrices based on a genetic algorithm. The processor may be further operable to apply a pseudorandom number generator to the one or more quasi-diagonal, low density, and non-zero matrices. In an example embodiment, calculation of the generating matrix includes selecting, from the one or more quasi-diagonal, low density, and non-zero matrices, a matrix having a largest minimum distance between codes. The generating matrix may be used to encode write data to obtain a code.

In an example embodiment, the parity check matrix and the decoding matrix can be generated by a partial solving of a linear system of equations. The linear system of equations can be associated with the generating matrix.

The processor 1110 may be further operable to detect the errors. The errors can be corrected using the set of matrices. Furthermore, the processor 1110 may be further operable to correct the errors using the set of matrices. The parity check matrix may be used to correct the code to obtain a corrected code. The decoding matrix may be used to decode the corrected code to obtain output data.

The system 1100 may also comprise a database 1120. The database 1120 may comprise computer-readable instructions for execution by the processor 1110.

Figure 12:
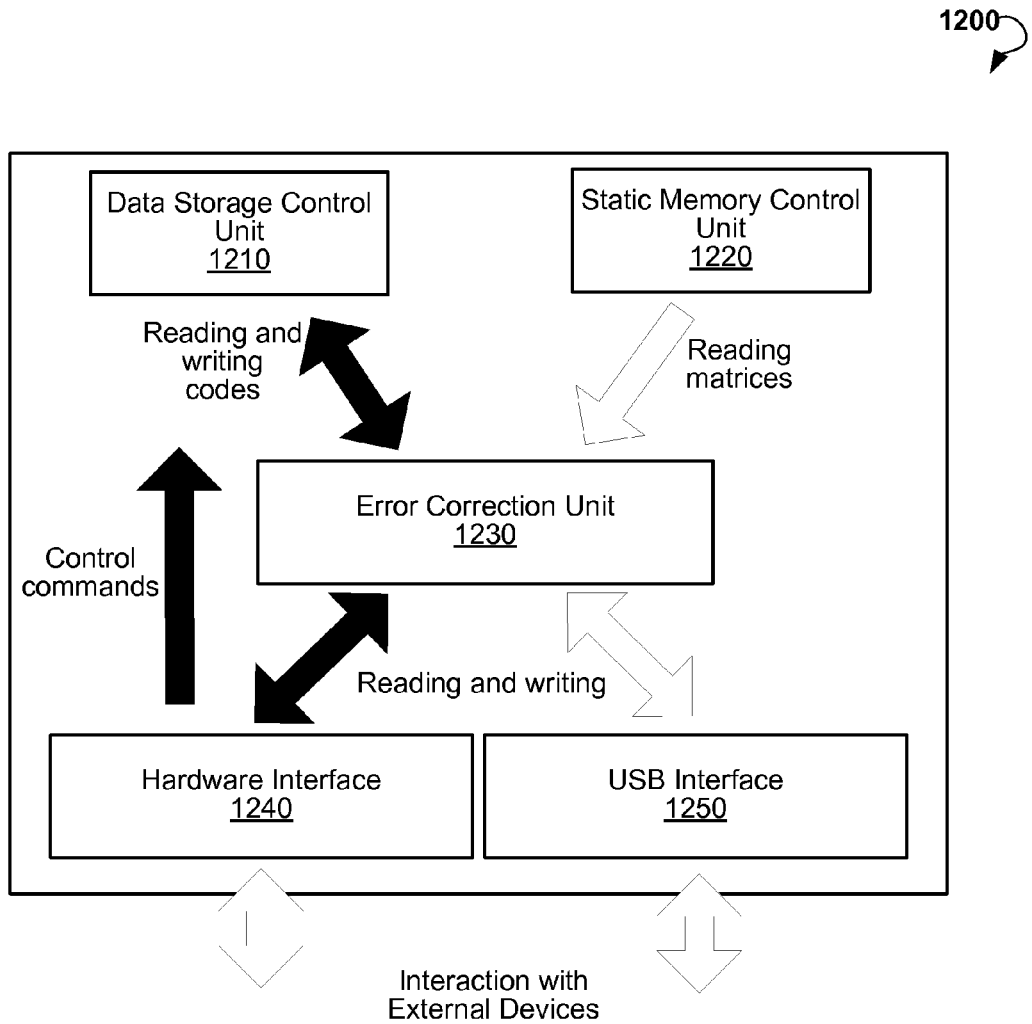
FIG. 12 is a block diagram showing a system for correction of errors on a hardware data storage, according to an example embodiment.

FIG. 12 illustrates a block diagram showing a system 1200 for correction of errors on a hardware data storage, where the hardware data storage is a NAND flash hardware data storage, according to an example embodiment. The architecture of the system 1200 may comprise a controller and a NAND flash hardware data storage. The controller may include a data storage control unit 1210. The data storage control unit 1210 may be responsible for reading and writing codes. The controller may include a static memory control unit 1220. The static memory control unit 1220 may be operable to read matrices. An error correction unit 1230 of the controller may be operable to code, correct, and decode data. The controller of the system 1200 may be operable to provide the processing speed of about dozens of millions of encoding and decoding operations in seconds. In an example embodiment, the controller of the system 1200 may be selected from a reduced instruction set computing (RISC) controller and a field-programmable gate array (FPGA) controller.

The NAND flash hardware data storage may include a hardware interface 1240. The hardware interface 1240 may be operable to read and write data from the ports of the hardware. In an example embodiment, the hardware interface 1240 may be operable to provide data addressing, storage, reading, writing, and erasing. In a further example embodiment, the hardware interface 1240 may be operable to provide control commands to the data storage control unit 1210.

The system 1200 may further comprise a USB interface 1250. The USB interface may include USB ports configured to read and write data. The system 1200 may further interact with a plurality of external devices.

In general, the system 1200 for correction of errors on the NAND flash hardware data storage may allow updating existing digital devices having hardware data storages by applying minimal software and hardware changes, and may increase reliability, durability, and survivability of the hardware data storages. The system 1200 may provide speed increase of the error correction and optimization of the used memory by analysis of NAND cell degrade statistics. Furthermore, the system 1200 may solve such problems in hardware implementation as hardware dimensions, calculation complexity, hardware restrictions, reliability problem associated with iLDPC initially developed for reception-transmission channels.

Figure 13:
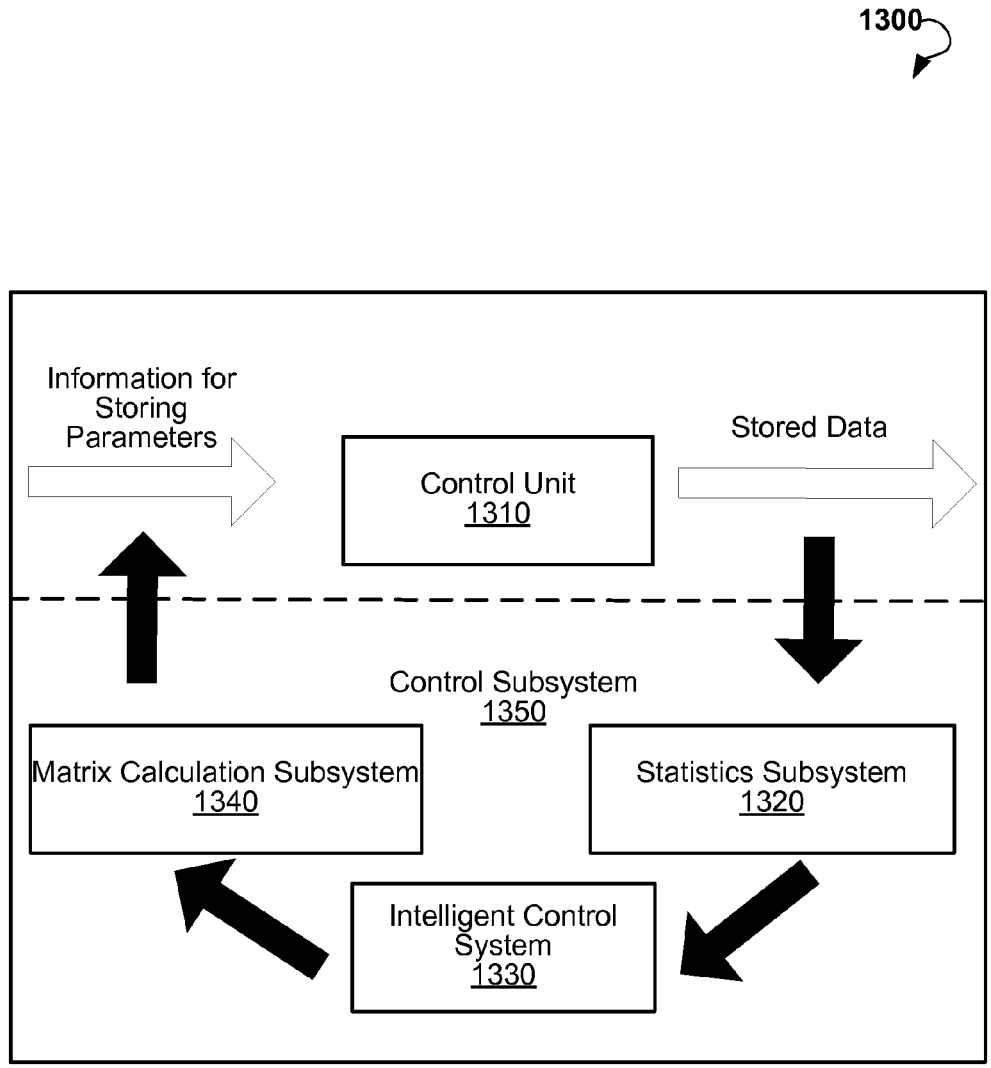
FIG. 13 is a block diagram illustrating a driving circuit of a system for correction of errors on a hardware data storage, according to an example embodiment.

FIG. 13 is a block diagram illustrating a driving circuit 1300 of a system for correction of errors on a hardware data storage, according to an example embodiment. The driving circuit 1300 may comprise a control unit 1310 of the system for correction of errors on the hardware data storage and a control subsystem 1350. The control unit 1310 may be operable to receive information for storing parameters of the system for correction of errors and provide stored data.

The control subsystem 1350 may comprise a matrix calculation subsystem 1340. The matrix calculation subsystem 1340 may be operable to calculate a generating matrix, parity check matrix, and decoding matrix. The control subsystem 1350 may further comprise a statistics subsystem 1320 operable to collect and store error statistics. An intelligent control system 1330 of the control subsystem 1350 may be operable to receive the statistics from the statistics subsystem 1320 and to initiate calculation of the matrices by the matrix calculation subsystem 1340.

Figure 14:
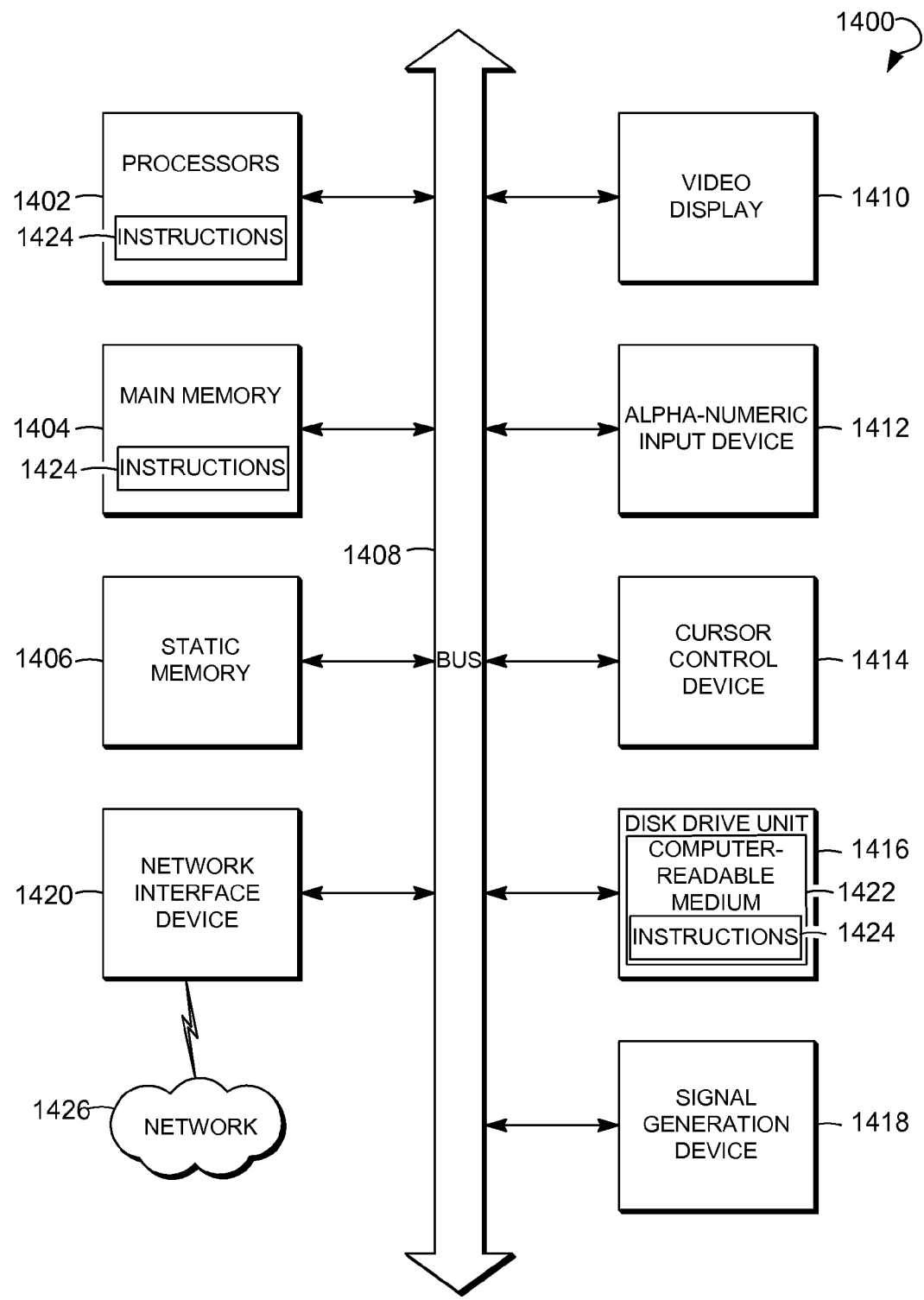
FIG. 14 shows a diagrammatic representation of an example machine in the form of a computer system within which a set of instructions for causing the machine to perform any one or more of the methodologies discussed herein is executed.

FIG. 14 shows a diagrammatic representation of a machine in the example electronic form of a computer system 1400, within which a set of instructions for causing the machine to perform any one or more of the methodologies discussed herein may be executed. In various example embodiments, the machine operates as a standalone device or is connected (e.g., networked) to other machines. In a networked deployment, the machine operates in the capacity of a server or a client machine in a server-client network environment, or as a peer machine in a peer-to-peer (or distributed) network environment. The machine includes a PC, a tablet PC, a set-top box (STB), a cellular telephone, a portable music player (e.g., a portable hard drive audio device such as an Moving Picture Experts Group Audio Layer 3 (MP3) player), a web appliance, a network router, switch or bridge, smart TV, Roku, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1400 includes a processor or multiple processors 1402 (e.g., a central processing unit (CPU), a graphics processing unit (GPU), or both), a main memory 1404 and a static memory 1406, which communicate with each other via a bus 1408. The computer system 1400 further includes a video display unit 1410 (e.g., a liquid crystal display (LCD) or a cathode ray tube (CRT)). The computer system 1400 also includes an alphanumeric input device 1412 (e.g., a keyboard), a cursor control device 1414 (e.g., a mouse), a disk drive unit 1416, a signal generation device 1418 (e.g., a speaker), and a network interface device 1420.

The disk drive unit 1416 includes a non-transitory computer-readable medium 1422, on which is stored one or more sets of instructions and data structures (e.g., instructions 1424) embodying or utilized by any one or more of the methodologies or functions described herein. The instructions 1424 also reside, completely or at least partially, within the main memory 1404 and/or within the processors 1402 during execution thereof by the computer system 1400. The main memory 1404 and the processors 1402 also constitute machine-readable media.

The instructions 1424 are further transmitted or received over a network 1426 via the network interface device 1420 utilizing any one of a number of well-known transfer protocols (e.g., Hyper Text Transfer Protocol (HTTP)).

In some embodiments, the computer system 1400 is implemented as a cloud-based computing environment, such as a virtual machine operating within a computing cloud. In other embodiments, the computer system 1400, in turn, includes a cloud-based computing environment, where the functionalities of the computer system 1400 are executed in a distributed fashion. Thus, the computer system 1400, when configured as a computing cloud, includes pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources are utilized exclusively by their owners or such systems are accessible to outside users who deploy applications within the computing infrastructure to obtain the benefit of large computational or storage resources.

The cloud is formed, for example, by a network of web servers that comprise a plurality of computing devices, such as the computing device 120, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media, and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during RF and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media are involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology is written in any combination of one or more programming languages, including an object oriented programming language such as Java, Smalltalk, C++ or the like and conventional procedural programming languages, such as the "C" programming language or similar programming languages. The program code may execute entirely on the user computer, partly on the user computer, as a stand-alone software package, partly on the user computer and partly on a remote computer, or entirely on the remote computer or server. In the latter scenario, the remote computer is connected to the user computer through any type of network, including a LAN or a WAN, or the connection is made to an external computer (for example, through the Internet using an Internet Service Provider (ISP)).

The corresponding structures, materials, acts, and equivalents of all means or steps plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Aspects of the present technology are described above with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions are provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions are also stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Thus, methods and systems for correction of errors on a hardware data storage have been disclosed. Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A method for correction of errors on a hardware data storage, the method comprising:
    receiving, by a processor, input data, wherein the input data includes at least error statistics data and reliability data;
    based on the input data, creating a set of matrices with predefined properties, wherein the set of matrices includes one or more quasi-diagonal, low density, and non-zero matrices;
    crossing the set of matrices, wherein the crossing includes one or more of the following: integration of portions of the one or more quasi-diagonal, low density, and non-zero matrices, superimposition of portions of the one or more quasi-diagonal, low density, and non-zero matrices, and selective integration of quasi-diagonals of the one or more quasi-diagonal, low density, and non-zero matrices;
    mutating the set of matrices, wherein the mutating includes one or more of the following: changing a position of diagonals of the one or more quasi-diagonal, low density, and non-zero matrices, changing a dimension of the diagonals of the one or more quasi-diagonal, low density, and non-zero matrices, and adding or deleting the diagonals of the one or more quasi-diagonal, low density, and non-zero matrices;
based on the mutating, calculating a generating matrix, the generating matrix having a largest minimum distance between codes;
based on the generating matrix, generating a parity check matrix;
detecting the errors using the parity check matrix; and
correcting the errors using the parity check matrix.

2. The method of claim 1, wherein the generating matrix is calculated using the one or more quasi-diagonal, low density, and non-zero matrices based on a genetic algorithm.

3. The method of claim 2, further comprising applying a pseudorandom number generator to the one or more quasi-diagonal, low density, and non-zero matrices.

4. The method of claim 2, wherein calculation of the generating matrix includes selecting, from the one or more quasi-diagonal, low density, and non-zero matrices, a matrix having the largest minimum distance between codes.

5. The method of claim 1, further comprising compressing each of the set of matrices.

6. The method of claim 1, wherein the parity check matrix is generated by a partial solving of a linear system of equations, the linear system of equations being associated with the generating matrix.

7. The method of claim 1, further comprising generating a decoding matrix, wherein the decoding matrix is generated by a partial solving of a linear system of equations, the linear system of equations being associated with the generating matrix.

8. The method of claim 1, wherein the generating matrix is used to encode write data to obtain a code.

9. The method of claim 8, wherein the parity check matrix is used to correct the code to obtain a corrected code.

10. The method of claim 9, wherein the decoding matrix is used to decode the corrected code to obtain output data.

11. A system for correction of errors on a hardware data storage, the system comprising:
a processor operable to:
receive input data, wherein the input data includes at least error statistics data and reliability data;
based on the input data, create a set of matrices with predefined properties, wherein the set of matrices includes one or more quasi-diagonal, low density, and non-zero matrices;
cross the set of matrices, wherein the crossing includes one or more of the following: integration of portions of the one or more quasi-diagonal, low density, and non-zero matrices, superimposition of portions of the one or more quasi-diagonal, low density, and non-zero matrices, and selective integration of quasi-diagonals of the one or more quasi-diagonal, low density, and non-zero matrices;
mutate the set of matrices, wherein the mutating includes one or more of the following: changing a position of diagonals of the one or more quasi-diagonal, low density, and non-zero matrices, changing a dimension of the diagonals of the one or more quasi-diagonal, low density, and non-zero matrices, and adding or deleting the diagonals of the one or more quasi-diagonal, low density, and non-zero matrices;
based on the mutating, select a generating matrix, the generating matrix having a largest minimum distance between codes;
based on the generating matrix, generate a parity check matrix;
detect the errors using the parity check matrix; and
correct the errors using the parity check matrix; and
a database comprising computer-readable instructions for execution by the processor.

12. The system of claim 11, wherein the generating matrix is calculated using the one or more quasi-diagonal, low density, and non-zero matrices based on a genetic algorithm.

13. The system of claim 12, wherein the processor is further operable to apply a pseudorandom number generator to the one or more quasi-diagonal, low density, and non-zero matrices.

14. The system of claim 12, wherein calculation of the generating matrix includes selecting, from the one or more quasi-diagonal, low density, and non-zero matrices, a matrix having the largest minimum distance between codes.

15. The system of claim 11, wherein the processor is further operable to compress each of the set of matrices.

16. The system of claim 11, wherein one or more of the parity check matrix the decoding matrix is generated by a partial solving of a linear system of equations, the linear system of equations being associated with the generating matrix.

17. The system of claim 11, wherein the generating matrix is used to encode write data to obtain a code.

18. The system of claim 17, wherein the parity check matrix is used to correct the code to obtain a corrected code.

19. The system of claim 18, wherein the processor is further operable to generate a decoding matrix, wherein the decoding matrix is used to decode the corrected code to obtain output data.

20. A non-transitory computer-readable medium having embodied thereon a program, the program providing instructions for a method for correction of errors on a hardware data storage, the method comprising:
receiving, by a processor, input data, wherein the input data includes at least error statistics data and reliability data;
based on the input data, creating a set of matrices with predefined properties, wherein the set of matrices includes one or more quasi-diagonal, low density, and non-zero matrices;
crossing the set of matrices, wherein the crossing includes one or more of the following: integration of portions of the one or more quasi-diagonal, low density, and non-zero matrices, superimposition of portions of the one or more quasi-diagonal, low density, and non-zero matrices, and selective integration of quasi-diagonals of the one or more quasi-diagonal, low density, and non-zero matrices;
mutating the set of matrices, wherein the mutating includes one or more of the following: changing a position of diagonals of the one or more quasi-diagonal, low density, and non-zero matrices, changing a dimension of the diagonals of the one or more quasi-diagonal, low density, and non-zero matrices, and adding or deleting the diagonals of the one or more quasi-diagonal, low density, and non-zero matrices;
based on the mutating, selecting a generating matrix, the generating matrix having a largest minimum distance between codes;
based on the generating matrix, generating a parity check matrix;
detecting the errors using the parity check matrix; and
correcting the errors using the parity check matrix.

* * * * *